US009202587B2

(12) United States Patent
Jo et al.

(10) Patent No.: US 9,202,587 B2
(45) Date of Patent: Dec. 1, 2015

(54) NONVOLATILE MEMORY DEVICE, MEMORY SYSTEM COMPRISING SAME, AND METHOD OF PROGRAMMING SAME

(71) Applicants: Jonghoo Jo, Hwaseong-si (KR); Hyun Jun Yoon, Seongnam-si (KR); Kitae Park, Seongnam-si (KR); Dongkyo Shim, Seoul (KR)

(72) Inventors: Jonghoo Jo, Hwaseong-si (KR); Hyun Jun Yoon, Seongnam-si (KR); Kitae Park, Seongnam-si (KR); Dongkyo Shim, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/278,743

(22) Filed: May 15, 2014

(65) Prior Publication Data

US 2015/0049545 A1 Feb. 19, 2015

(30) Foreign Application Priority Data

Aug. 14, 2013 (KR) ........................ 10-2013-0096566

(51) Int. Cl.
| | |
|---|---|
| *G11C 11/34* | (2006.01) |
| *G11C 16/34* | (2006.01) |
| *G11C 16/10* | (2006.01) |
| *G11C 16/04* | (2006.01) |
| *G11C 16/08* | (2006.01) |

(52) U.S. Cl.
CPC ........ *G11C 16/3459* (2013.01); *G11C 16/0483* (2013.01); *G11C 16/08* (2013.01); *G11C 16/10* (2013.01)

(58) Field of Classification Search
CPC . G11C 16/0483; G11C 16/10; G11C 16/3459
USPC ......................................... 365/185.03, 185.24
See application file for complete search history.

(56) References Cited

U.S. PATENT DOCUMENTS

| | | | |
|---|---|---|---|
| 6,856,546 B2 * | 2/2005 | Guterman et al. | ......... 365/185.2 |
| 7,359,248 B2 | 4/2008 | Chen et al. | |
| 7,561,471 B2 | 7/2009 | Park et al. | |
| 7,688,638 B2 | 3/2010 | Hemink | |
| 7,855,913 B2 * | 12/2010 | Fernandes | ................ 365/185.03 |
| 7,936,602 B2 | 5/2011 | Li et al. | |
| 7,978,541 B2 | 7/2011 | Sutardja | |
| 8,223,559 B2 * | 7/2012 | Ho et al. | .................. 365/185.24 |
| 8,250,286 B2 | 8/2012 | Yeh | |
| 8,325,517 B2 | 12/2012 | Kim et al. | |
| 8,355,280 B2 | 1/2013 | Yoon et al. | |
| 8,411,502 B2 | 4/2013 | Yoon et al. | |
| 8,644,066 B2 * | 2/2014 | Park | ........................ 365/185.03 |
| 2011/0205817 A1 | 8/2011 | Yoon et al. | |
| 2013/0042058 A1 | 2/2013 | Oh et al. | |
| 2013/0145234 A1 | 6/2013 | Yoon et al. | |
| 2014/0281842 A1 * | 9/2014 | Wood et al. | .................... 714/799 |
| 2015/0003152 A1 * | 1/2015 | Kwak et al. | ............. 365/185.03 |
| 2015/0039809 A1 * | 2/2015 | Kim et al. | ...................... 711/103 |

\* cited by examiner

*Primary Examiner* — Viet Q Nguyen

(74) *Attorney, Agent, or Firm* — Volentine & Whitt, PLLC

(57) ABSTRACT

A method of programming a nonvolatile memory device comprises performing an N-th program loop based on state data stored in data latches according to a default state ordering, determining whether conversion of the default state ordering is required according to a predetermined criterion, as a consequence of determining that conversion of the default state ordering is required, converting all or part of the state data stored in the data latches from the default state ordering to another state ordering, and performing a (N+1)th program loop based on the converted state data.

12 Claims, 17 Drawing Sheets

NONVOLATILE MEMORY DEVICE, MEMORY SYSTEM COMPRISING SAME, AND METHOD OF PROGRAMMING SAME

CROSS-REFERENCE TO RELATED APPLICATIONS

This application claims priority under 35 U.S.C. §119 to Korean Patent Application No. 10-2013-0096566 filed on Aug. 14, 2013, the subject matter of which is hereby incorporated by reference.

BACKGROUND OF THE INVENTION

The inventive concept relates to nonvolatile memory devices, memory systems comprising nonvolatile memory devices, and methods of programming nonvolatile memory devices.

Semiconductor memory devices can be roughly divided into two categories according to whether they retain stored data when disconnected from power. These categories include volatile semiconductor memory devices, which lose stored data when disconnected from power, and nonvolatile semiconductor memory devices, which retain stored data when disconnected from power. Examples of volatile memory devices include dynamic random access memory (DRAM) and static random access memory (SRAM). Examples of nonvolatile memory devices include resistive random access memory (RRAM), phase-change random access memory (PRAM), and flash memory.

Due to a persistent increase in the demand for nonvolatile data storage, researchers are engaged in continual efforts to improve various aspects of nonvolatile memory devices, such as storage capacity, performance, reliability, and others.

SUMMARY OF THE INVENTION

In one embodiment of the inventive concept, a method of programming a nonvolatile memory device comprises performing an N-th program loop based on state data stored in data latches according to a default state ordering, determining whether conversion of the default state ordering is required according to a predetermined criterion, as a consequence of determining that conversion of the default state ordering is required, converting all or part of the state data stored in the data latches from the default state ordering to another state ordering, and performing a (N+1)th program loop based on the converted state data.

In another embodiment of the inventive concept, a method of programming a nonvolatile memory device comprises determining whether a predetermined state is program passed, as a consequence of determining that the predetermined state is program passed, converting all or part of state data in data latches from a first state ordering to a second state ordering, performing a program operation based on the converted state data, and after the program operation is executed, performing a verification operation based on the converted state data.

In yet another embodiment of the inventive concept, a method of programming a nonvolatile memory device comprises performing a coarse program operation using a first state ordering, and performing a fine program operation using a second state ordering to narrow a threshold voltage distribution produced by the coarse program operation. State data according to the first state ordering is produced by converting all or part of state data according to the second state ordering.

In yet another embodiment of the inventive concept, a nonvolatile memory device comprises a memory cell array comprising multiple memory blocks each comprising memory cells arranged at intersections of word lines and bit lines, an address decoder configured to selected one of the memory blocks and one of the word lines based on an address received in a program operation, an input/output circuit comprising page buffers respectively connected to the bit lines, and control logic configured to control the address decoder and the input/output circuit. Each of the page buffers comprises at least one sense latch configured to store data indicating whether to perform a sensing operation and to store sense data by latching a voltage of a corresponding bit line after the sensing operation is performed on memory cells connected to the selected word line, data latches configured to store state data corresponding to a state to be programmed at the program operation, a cache latch configured to receive program data from an external device in the program operation and to transfer the input program data to the data latches, and a pre-charge circuit configured to apply a pre-charge voltage to a corresponding bit line according to data stored in the at least one sense latch before the sensing operation. The control logic comprises a state data converter that determines whether converting of state data stored in the data latches from a first state ordering to a second state ordering is required and converts all or part of the state data in the data latches as a consequence of determining that converting of state data stored in the data latches is required.

In yet another embodiment of the inventive concept, a memory system comprises at least one nonvolatile memory device configured to perform a multi-bit program operation using a default state ordering, and a memory controller configured to control the at least one nonvolatile memory device. The at least one nonvolatile memory device converts all or part of state data according to the default state ordering based on state data converting information.

These and other embodiments of the inventive concept can potentially improve the performance of programming operations and other functions by changing a state ordering of stored data.

BRIEF DESCRIPTION OF THE DRAWINGS

The drawings illustrate selected embodiments of the inventive concept. In the drawings, like reference numbers indicate like features.

DETAILED DESCRIPTION

Embodiments of the inventive concept are described below with reference to the accompanying drawings. These embodiments are presented as teaching examples and should not be construed to limit the scope of the inventive concept.

Unless otherwise defined, all terms (including technical and scientific terms) used herein have the same meaning as commonly understood by one of ordinary skill in the art. Terms such as those defined in commonly used dictionaries should be interpreted as having a meaning that is consistent with their meaning in the context of the relevant art and/or the this specification and will not be interpreted in an idealized or overly formal sense unless expressly so defined herein.

In certain embodiments described below, a nonvolatile memory device may improve programming speed by changing a state data during a program operation. The nonvolatile memory device may be a NAND flash memory, a vertical NAND flash memory (VNAND), a NOR flash memory, a resistive RAM (RRAM), a phase-change RAM (PRAM), a magnetoresistive RAM (MRAM), or a Spin Transfer Torque Random Access Memory (STT-RAM), for example. The nonvolatile memory device may be implemented with a three-dimensional array structure. The inventive concept is applicable not only to flash memory devices where a charge storage layer is formed of a floating gate, but also to charge trap flash (CTF) memory where a charge storage layer is formed of an insulation film. Below, it is assumed that a nonvolatile memory device is a NAND flash memory device.

The described embodiments may improve programming speed by changing/adjusting/controlling/modifying a state ordering of a program operation. Here, the "state ordering" refers to a correspondence between states of memory cells and data represented by those states. For instance, in a multi-bit memory cell, a predetermined threshold voltage state may correspond to a first data state (e.g., "11") in one state ordering, and a second data state (e.g., "01") in another state ordering.

Figure 1:
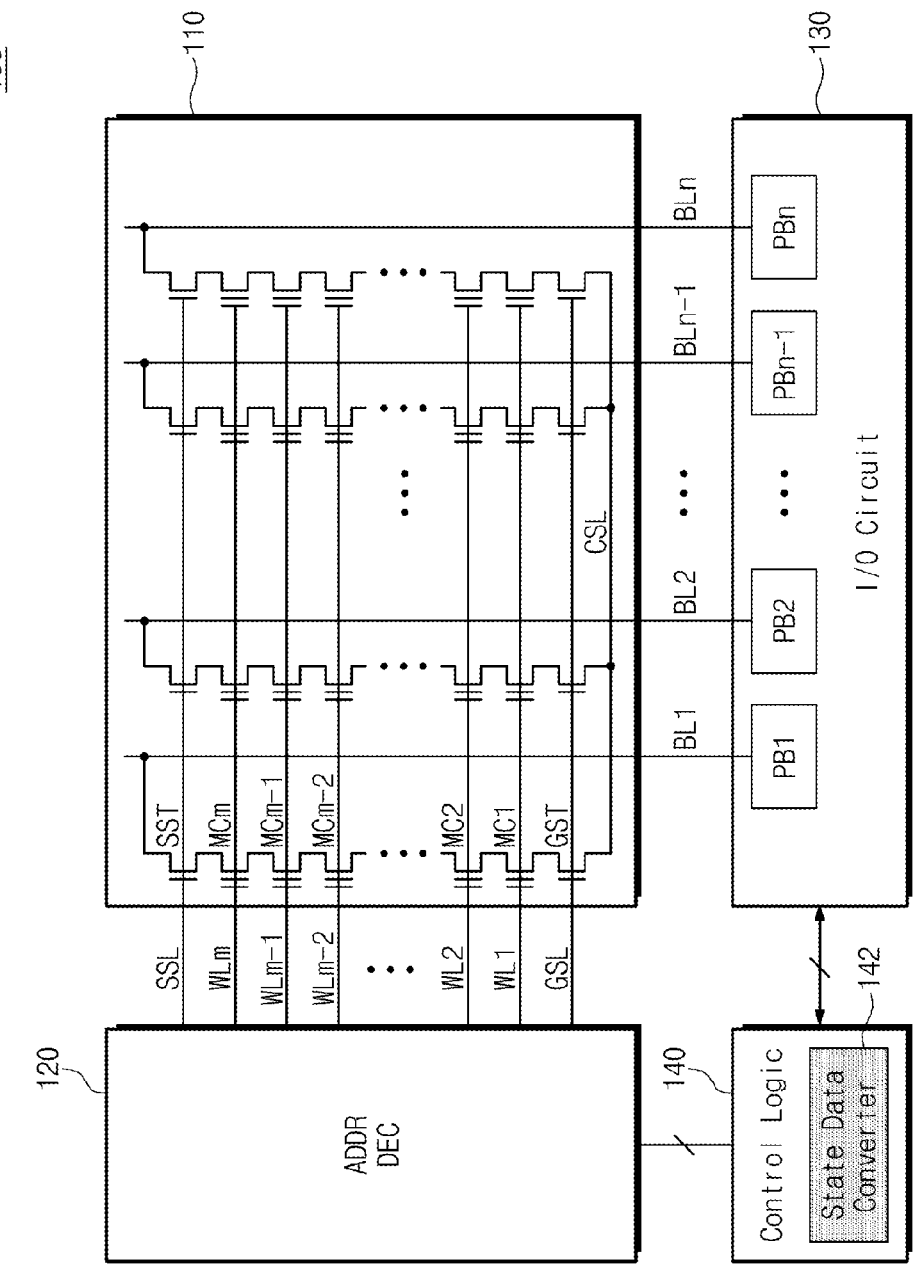
FIG. 1 is a block diagram illustrating a nonvolatile memory device, according to an embodiment of the inventive concept.

FIG. 1 is a block diagram illustrating a nonvolatile memory device according to an embodiment of the inventive concept.

Referring to FIG. 1, a nonvolatile memory device 100 comprises a memory cell array 110, an address decoder 120, an input/output circuit 130, and control logic 140.

Memory cell array 110 comprises multiple memory blocks. In FIG. 1, a memory block is illustrated for ease of description. The memory block comprises strings respectively connected to bit lines BL1 to BLn (n>1). Here, the string comprises a string selection transistor SST, memory cells MC1 to MCm (m>1), and a ground selection transistor GST connected in series. String selection transistor SST is driven by a voltage transferred through a string selection line SSL. Ground selection transistor GST is driven by a voltage transferred through a ground selection line GSL. Memory cells MC1 to MCm store one or more bits and are driven by voltages transferred through corresponding word lines WL1 to WLm.

Address decoder 120 selects one of the memory blocks in response to an address and provides corresponding word lines with word line voltages for driving, such as a program voltage, a pass voltage, an erase voltage, a verification voltage, a read voltage, a read pass voltage, etc.

During a program operation, input/output circuit 130 temporarily stores data input from an external device and loads it onto a page to be written. During a read operation, input/output circuit 130 reads and buffers data from a page to be read and outputs it to the external device. Input/output circuit 130 comprises page buffers PB1 to PBn respectively corresponding to bit lines BL1 to BLn.

Each of page buffers PB1 to PBn comprises multiple latches for a program/read operation. The latches may comprise, for example, a sense latch, a cache latch, and data latches. During a read/verification operation, the sense latch stores data indicating a state where a sensing operation is to be performed before the sensing operation, and stores data read from a memory cell after the sensing operation. The cache latch temporarily stores data stored in data latches during a program operation. The data latches stores state data indicating a state to be programmed during a program operation.

Control logic 140 controls operations of nonvolatile memory device 100. Control logic 140 decodes control signals and a command provided from an external memory controller and controls address decoder 120 and input/output circuit 130 in response to the decoding result. Although not shown, control logic 140 controls a voltage generating circuit to generate voltages needed for driving (e.g., a program/read/erase operation), controls address decoder 120 to transfer the generated voltages to corresponding word lines WL1 to WLm, and controls input/output circuit 130 to receive page data to be programmed and to output read page data.

In particular, control logic 140 comprises a state data converter 142. State data converter 142 converts state data stored in page buffers PB1 to PBn when a predetermined condition is satisfied in a program operation.

In some embodiments, where a predetermined state is program passed, state data converter 142 converts the state data stored in page buffers PB1 to PBn to improve a programming speed. In some embodiments, where the number of program loops exceeds a predetermined number, state data converter 142 converts the state data stored in page buffers PB1 to PBn to improve programming speed.

A conversion of state data for a program operation may be viewed as a conversion of a state ordering. Control logic 140 controls page buffers PB1 to PBn to use state data according to a default state ordering until some point of time and thereafter to use the converted state data according to a converted state ordering. Here, the conversion of state data may include conversion of all or part of state data.

The nonvolatile memory device may improve programming speed by reducing the number of dumping operations internally performed between latches through converting of state data in a program operation.

Figure 2:
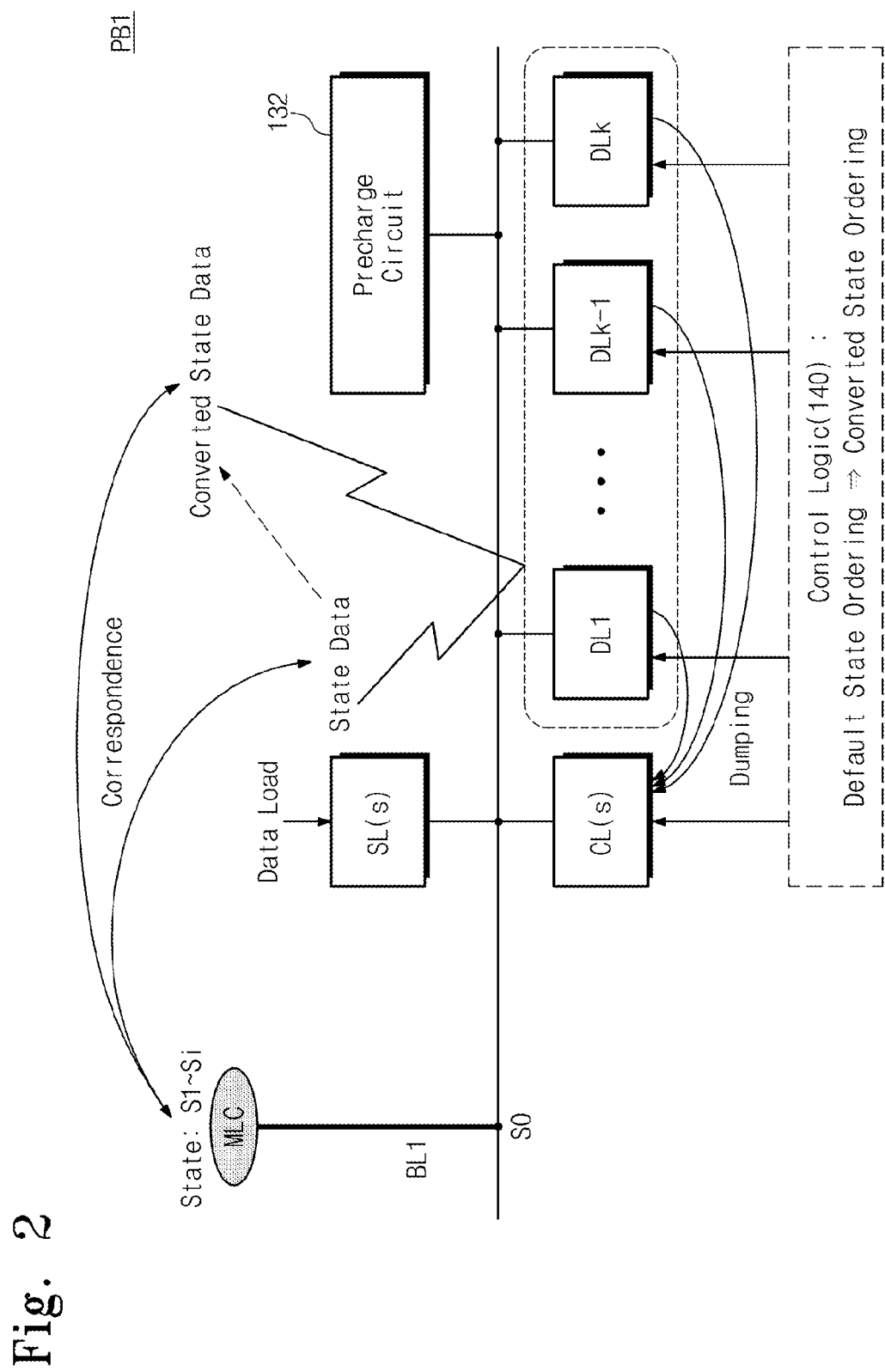
FIG. 2 is a diagram illustrating a page buffer shown in FIG. 1, according to an embodiment of the inventive concept.

FIG. 2 is a diagram illustrating a page buffer shown in FIG. 1, according to an embodiment of the inventive concept.

Referring to FIG. 2, a page buffer PB1 comprises a pre-charge circuit 132, one or more sense latches SL, one or more cache latches CL, and data latches DL1 to DLk (k>1).

Pre-charge circuit 132 provides a pre-charge voltage to a selected bit line BL1 during a sensing operation of a read/verification operation. Here, bit line BL1 is connected to a multi-level cell MLC. In some embodiments, bit line BL1 is selected according to a value stored in sense latch SL.

The one or more sense latches SL stores data indicating whether the multi-level cell MLC is a sensing target before a sensing operation, that is, data indicating selection of bit line BL1 or stores data stored in the multi-level cell MLC connected to bit line BL1 by latching a voltage of a sensing node S0 after the sensing operation.

Data latches Dl1 to DLk stores state data indicating a state to be programmed at the multi-level cell MLC in a program operation. Here, a program state is one of multiple states S1 to Sk.

In a program operation, the one or more cache latches CL receives data from the external device and transfers the input data to corresponding data latches DL1 to DLk. For example, during a verification operation on a specific state, control logic 140 determines whether a state to be programmed at the multi-level cell MLC is a specific state by sequentially reading state data dumped from data latches DL1 to DLk to sense latch SL, and stores a value corresponding to the determination result in sense latch SL.

In some embodiments, a determination of whether to apply a pre-charge voltage to bit line BL1 connected to the multi-level cell MLC is performed based on a value stored in sense latch SL before a sensing operation. That is, pre-charge circuit 132 applies a pre-charge voltage to bit line BL1 based on a value stored in sense latch SL.

Also, in some embodiments, after the sensing operation, sense latch SL stores data indicating whether a program operation on the multi-level cell MLC is successful. Program pass/fail is determined by comparing values stored in data latches DL1 to DLk and a value stored in sense latch SL.

State data conversion is performed to reduce the number of dumping operations required to determine whether a specific state is a state to be programmed, in the verification operation. Where a predetermined condition is satisfied, control logic 140 converts state data stored in data latches DL1 to DLk. Here, both the state data and the converted state data may direct a state to be programmed of the multi-level cell MLC.

As indicated by the foregoing, data latches DL1 to DLk of page buffer PB1 store state data according to a default state ordering by control logic 140 and thereafter stores converted state data according to a state ordering converted by control logic 140.

For ease of description, below, it is assumed that the multi-level cell MLC of the inventive concept is programmed to have one of eight states, although other configurations are possible.

Figure 3:
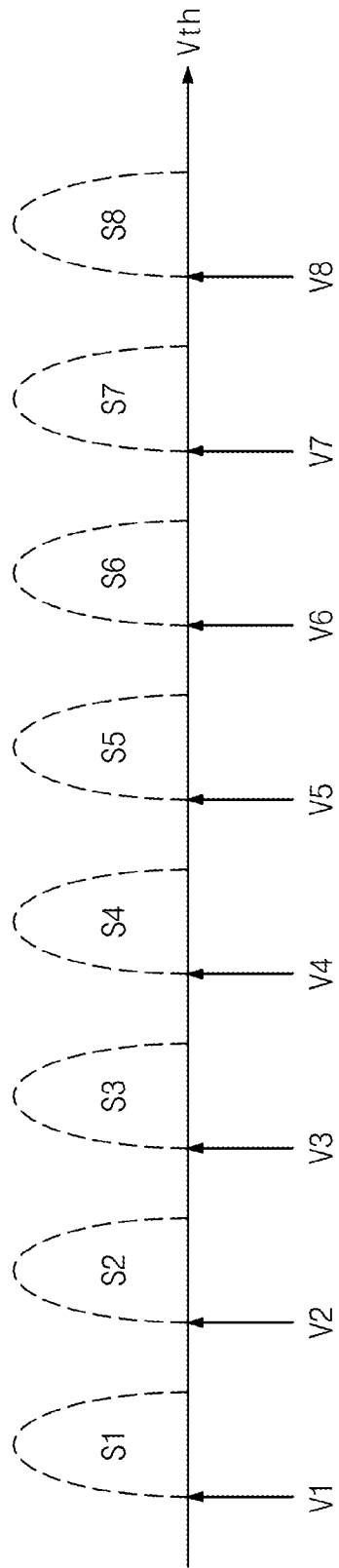
FIG. 3 is a diagram illustrating threshold voltage distributions of multi-level cells, according to an embodiment of the inventive concept.

FIG. 3 is a diagram illustrating threshold voltage distributions of multi-level cells, according to an embodiment of the inventive concept.

Referring to FIG. 3, a multi-level cell MLC is programmed to have one of eight states S1 to S8. The multi-level cell MLC is referred to a 3-bit memory cell or an 8-level memory cell. Voltages V1 to V8 shown in FIG. 3 are verification voltages for verifying states S1 to S8.

Figure 4:
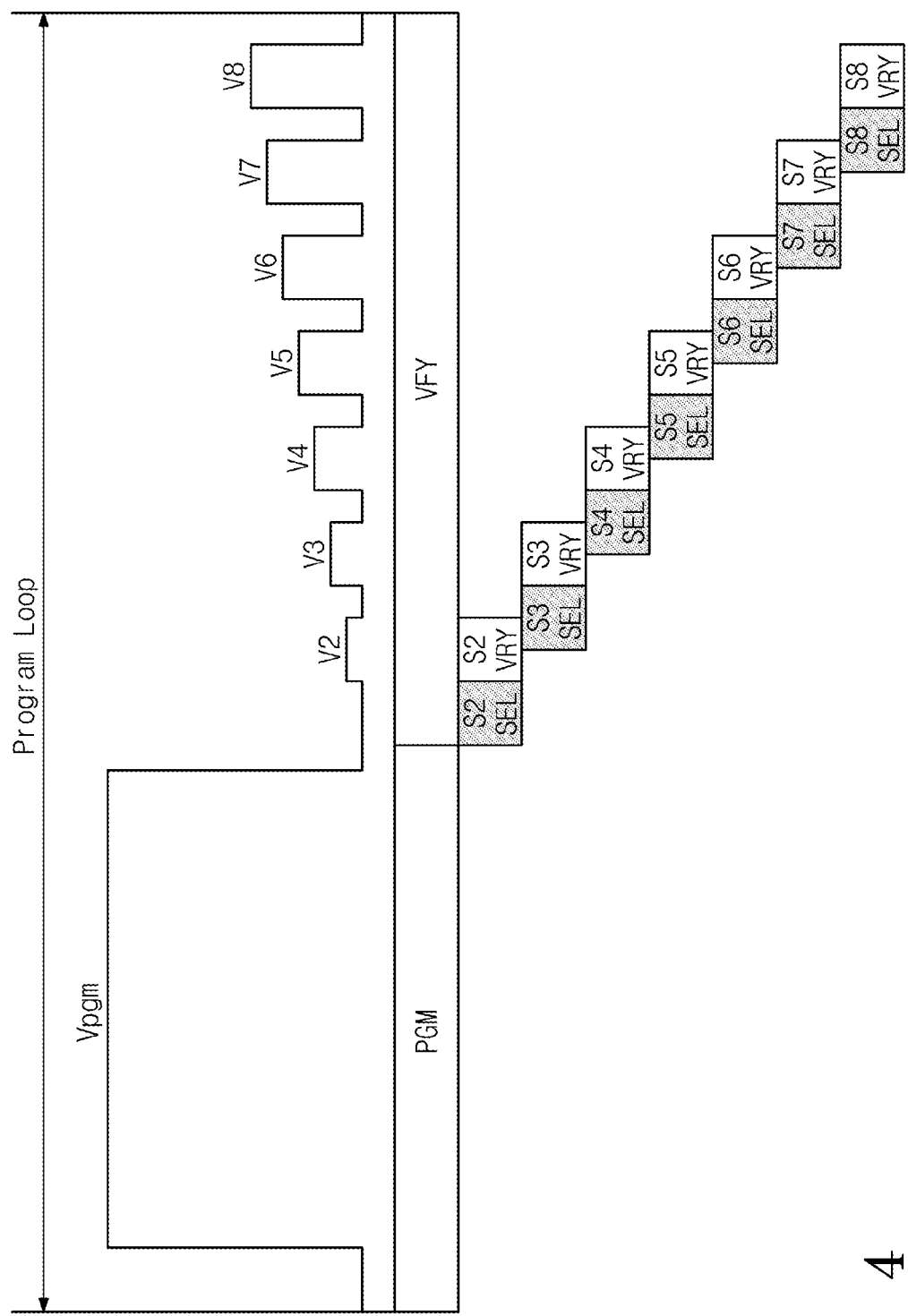
FIG. 4 is a diagram illustrating a program loop, according to an embodiment of the inventive concept.

FIG. 4 is a diagram illustrating a program loop, according to an embodiment of the inventive concept.

Referring to FIG. 4, a program loop is divided into a program operation period where a program voltage Vpgm is applied and a verification operation period where verification pulses V2 to V8 are applied. The verification operation periods include periods for verifying second to eighth states S2 to S8. A verification operation period of each of the second to eighth states S2 to S8 is divided into a state selection period for selecting a state corresponding to a verification target and a verification pulse applying period where a verification pulse is applied to verify the selected state. For example, when second state S2 is verified, a selection period S2 SEL on second state S2 and a verification pulse applying period S2 VRY on selected state S2 are performed.

As illustrated in FIG. 4, a state corresponding to a verification target is selected to perform a verification operation on each of states S2 to S8. This reduces the number of dumping operations for selecting a state corresponding to a verification target by converting state data. In FIG. 4, a verification operation on a first state S1 being an erase state is not performed. However, the inventive concept are not limited thereto. For example, a verification operation on first state S1 may be performed in alternative embodiments.

Figure 5:
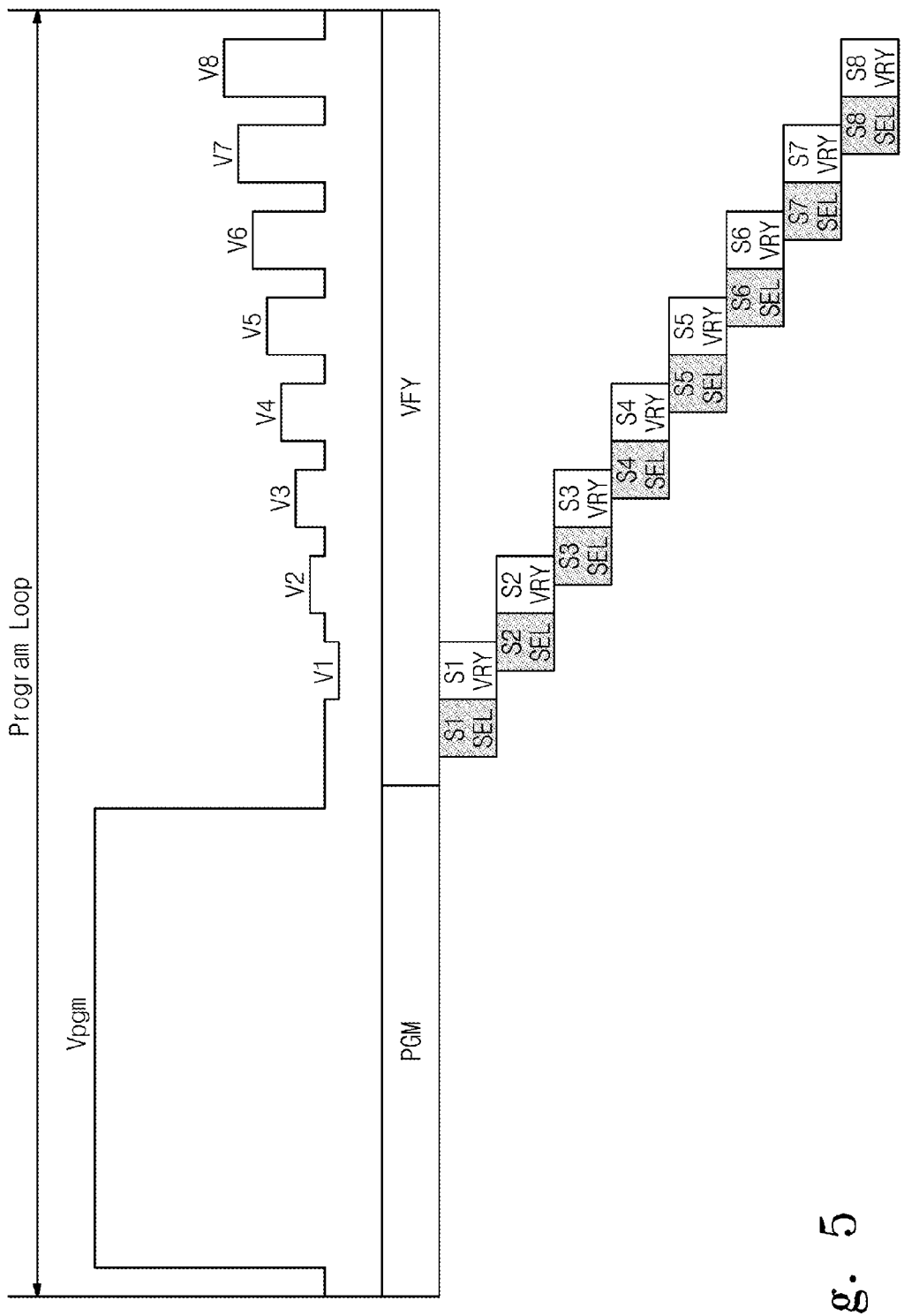
FIG. 5 is a diagram illustrating a program loop, according to another embodiment of the inventive concept.

FIG. 5 is a diagram illustrating a program loop according to another embodiment of the inventive concept. A program loop shown in FIG. 5 is different from that shown in FIG. 4 in that a verification period on a first state S1 is added.

In some embodiments, a verification pulse V1 of first state S1 has a negative voltage. In some other embodiments, one or more ones one of verification pulses V1 to V8 may have a negative voltage.

Figure 6:
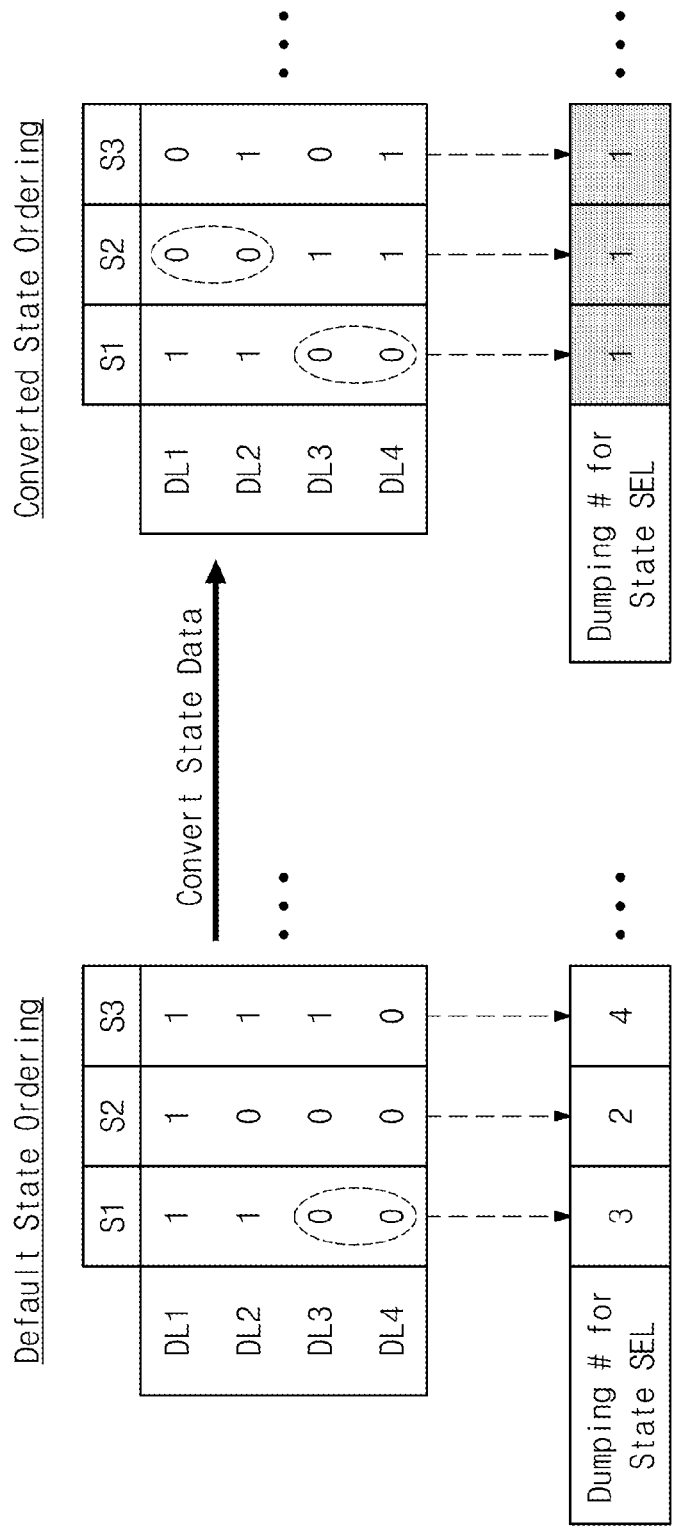
FIG. 6 is a diagram for describing an effect whereby a number of dumping operations is reduced when state data is converted, according to an embodiment of the inventive concept.

FIG. 6 is a diagram for describing an effect whereby the number of dumping operations is reduced when state data is converted, according to an embodiment of the inventive concept. For convenience, FIG. 6 illustrates the number of dumping operations performed to select a first state S1. Also, in FIG. 6, it is assumed that to select first state S1, states where a third data latch DL3 and a fourth data latch DL4 are '1' are all selected, a state where a first data latch DL1 is not '0' is unselected, and a state where a second latch DL2 is not '1' is unselected. At this time, the number of dumping operations performed to select first state S1 when state data according to a default state ordering is used is 3 in case of first state S1, 2 in case of second state S2, and 4 in case of third state S3.

On the other hand, the number of dumping operations performed to select a state when state data according to a converted default state ordering is used is reduced, that is, 1 in case of first state S1, 1 in case of second state S2, and 1 in case of third state S3. As described above, if state data is converted, the number of dumping operations performed to select a state is considerably reduced.

A method of selecting first state S1 is not limited to the above-described method. In some other embodiments, to select first state S1, states where first data latch DL1 and second data latch DL2 are '1' are all selected, a state where third data latch DL3 is not '0' is unselected, and a state where fourth latch DL4 is not '0' is unselected. Alternatively, first state S1 may be selected by other methods. Although FIG. 6 illustrates a method of selecting first state S1, such a method is similarly applicable to other states.

Figure 7:
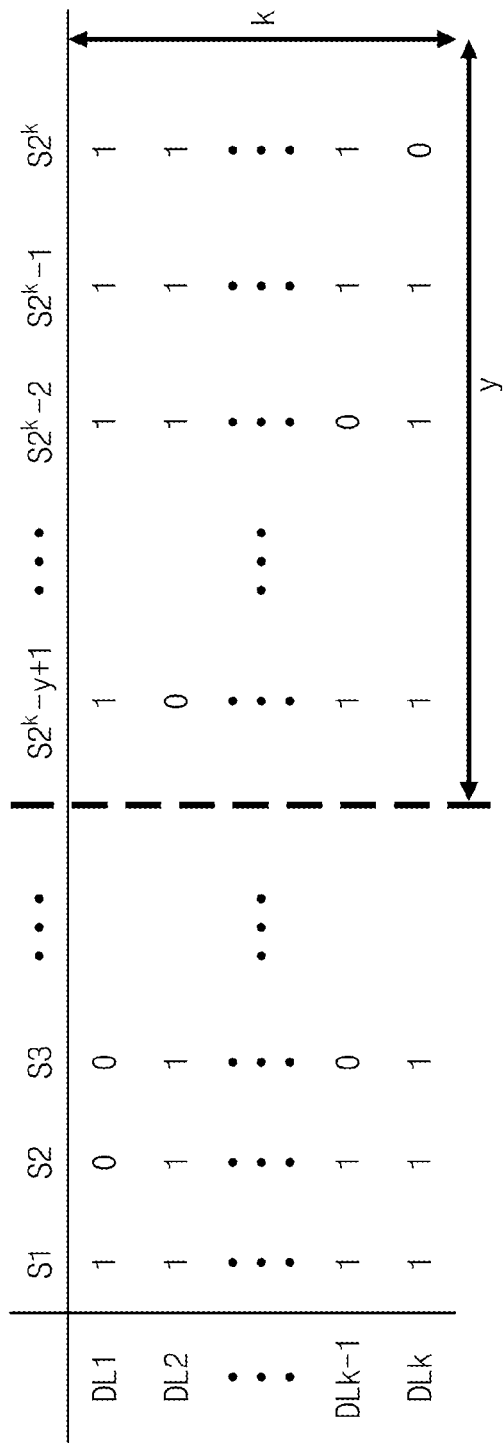
FIG. 7 is a diagram illustrating a default state ordering of a k-bit multi-level cell, according to an embodiment of the inventive concept.

FIG. 7 is a diagram illustrating a default state ordering on a k-bit multi-level cell according to an embodiment of the inventive concept.

Referring to FIG. 7, the number of states to be programmed is $2^k$, and the number of data latches DL1 to DLk is k. State data is converted such that states S1 to $S2^k$ are distinguishable by a binary combination as follows. For this, the number of cases on states distinguishable by a combination of k bits satisfies the following equation (1).

$$y = MAX(_kC_x), (0<x<k) \quad (1)$$

In equation (1), 'C' is a combination function, 'x' indicates the number of 1's or 0's, MAX is a maximum function and y is a maximum value of kCx. Thus, remaining state data after an $S(2^k-y)$ state is passed may be changed.

Figure 8:
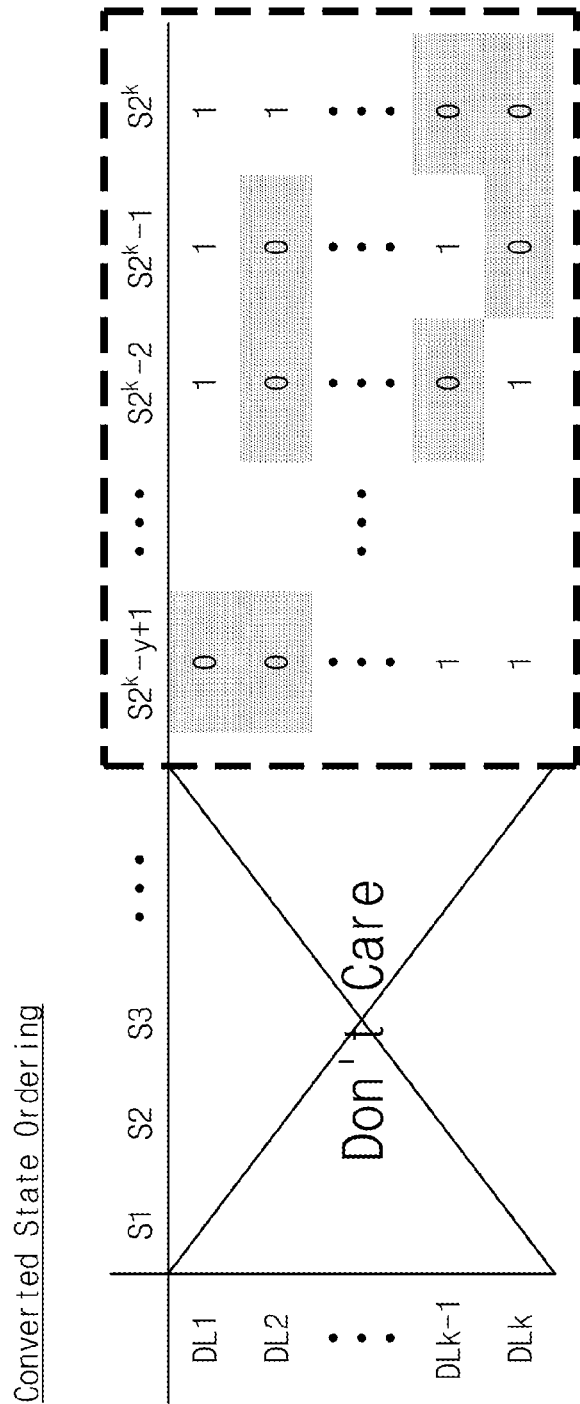
FIG. 8 is a diagram illustrating a converted state ordering of a k-bit multi-level cell, according to an embodiment of the inventive concept.

FIG. 8 is a diagram illustrating a converted state ordering on a k-bit multi-level cell according to an embodiment of the inventive concept.

Referring to FIG. 8, states S1 to $S2^k$-y are "don't care" states and state data corresponding to remaining states is converted to reduce the number of dumping operations needed to select a state.

In a reprogramming method, multiple multi-bit program operations are performed such that a width of a threshold voltage distribution corresponding to a data value to be stored becomes narrow. That is, the reprogramming method includes a coarse program operation where a threshold voltage distribution is roughly formed through multi-bit programming and a fine program operation where the threshold voltage distribution formed through the coarse program operation is finely adjusted. Examples of a reprogramming method are disclosed in U.S. Pat. Nos. 8,411,502 and 8,355,280 and U.S. Patent Publication Nos. 2011/0205817 and 2013/0145234, the subject matter of which is hereby incorporated by reference.

Figure 9:
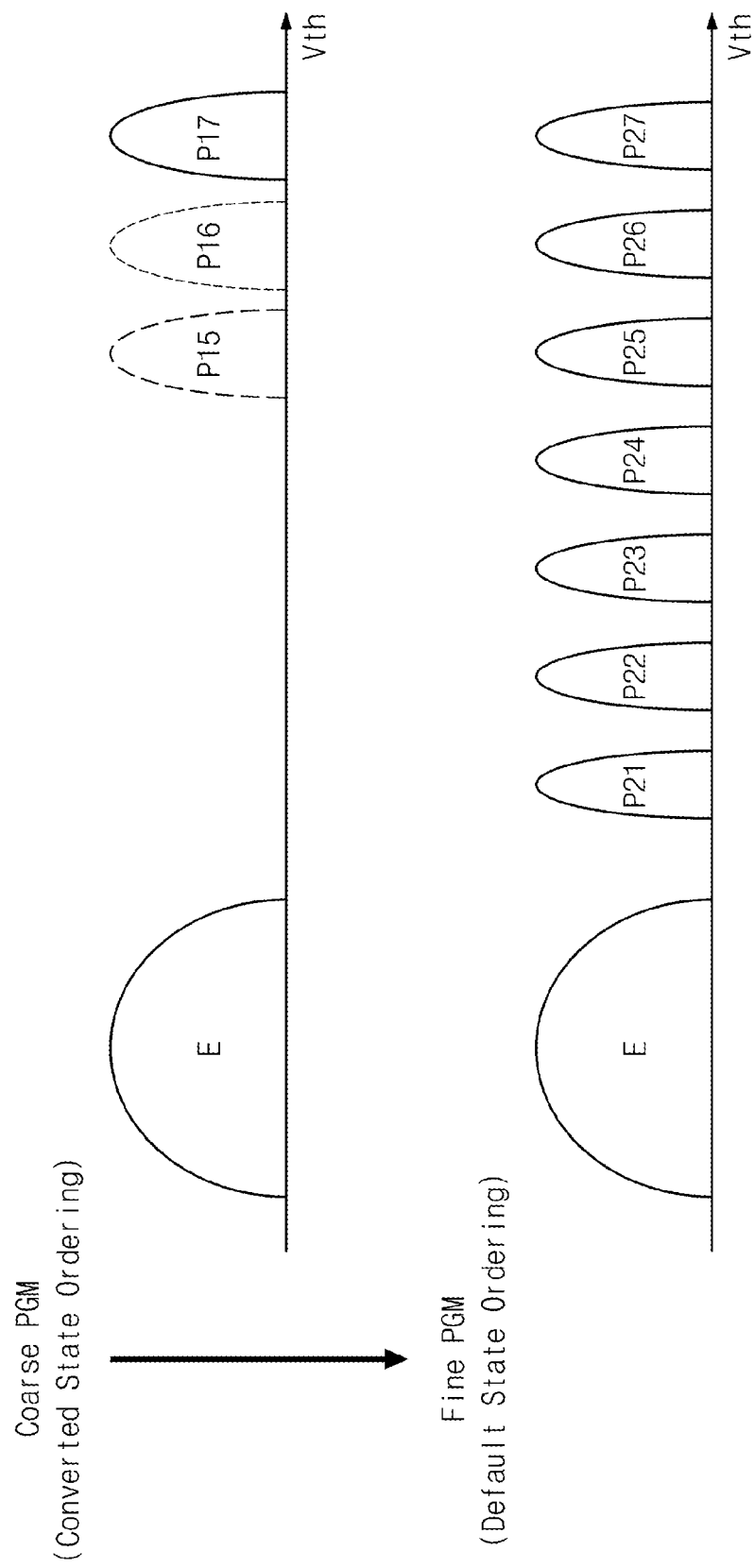
FIG. 9 is a diagram illustrating a reprogramming method for a nonvolatile memory device, according to an embodiment of the inventive concept.

FIG. 9 is a diagram illustrating a reprogramming method, according to an embodiment of the inventive concept.

Referring to FIG. 9, a coarse program operation uses a part (e.g., P15, P15, and P17) of upper states. Program and verification operations on remaining states are not required. Thus, the coarse program operation uses converted state data according to a converted state ordering to improve a programming speed. Thereafter, a fine program operation uses default state data according to a default state ordering. The reprogramming method may improve programming speed by converting state data and performing the coarse program operation.

Figure 10:
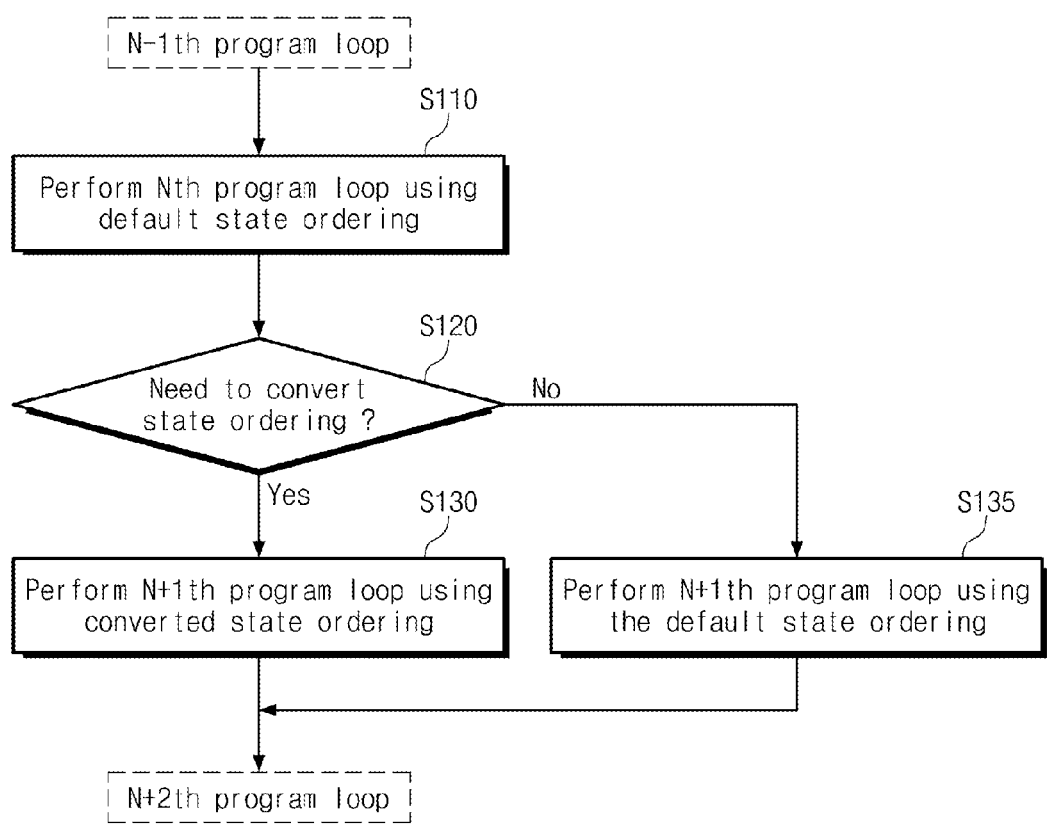
FIG. 10 is a flowchart illustrating a program loop, according to an embodiment of the inventive concept.

FIG. 10 is a flowchart illustrating a program loop, according to an embodiment of the inventive concept.

Referring to FIGS. 1 and 10, in step S110, an Nth program loop is performed using a default state ordering. In step S120, it is determined whether to convert a state ordering after the Nth program loop is performed. In some embodiments, the determination of whether to convert a state ordering is performed according to the number of program loops. For example, where the number of program loops exceeds a predetermined value, a state ordering may be converted. In some embodiments, the determination of whether to convert a state ordering is performed according to whether a predetermined state is passed. For example, when a fifth state S5 shown in FIG. 3 is passed, a state ordering need be converted. In some other embodiments, whether to convert a state ordering is decided according to state data converting information internally generated or provided from an external device.

As a consequence of determining that a state ordering is to be converted, in step S130, a (N+1)th program loop is performed using the converted state ordering. Here, the converted state ordering is different from the default state ordering. That is, all or part of state data according to the default state ordering is converted. As a consequence of determining that no state ordering need be converted, in step S135, the (N+1)th program loop is performed using the default state ordering. A program loop according to an embodiment of the inventive concept may be performed under such a condition that a state ordering is converted.

Figure 11:
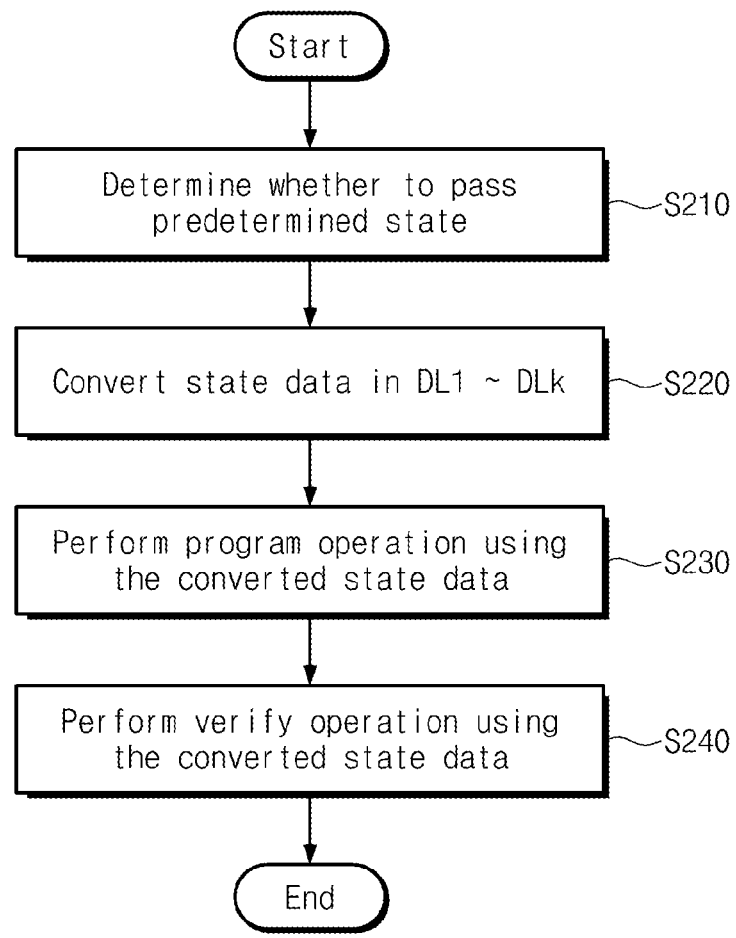
FIG. 11 is a flowchart illustrating a program method, according to an embodiment of the inventive concept.

FIG. 11 is a flowchart illustrating a program method according to an embodiment of the inventive concept.

Referring to FIGS. 1 to 11, in step S210, a determination is made as to whether a predetermined state is passed. As a consequence of determining that the predetermined state is passed, in step S220, all or part of state data stored in data latches DL1 to DLk is converted. In operation S230, a program operation is performed using the converted state data. After the program operation is performed, in step S240, a verification operation is performed using the converted state data. The program method converts state data according to whether a particular state is passed and performs a program/verification operation using the converted state data.

Figure 12:
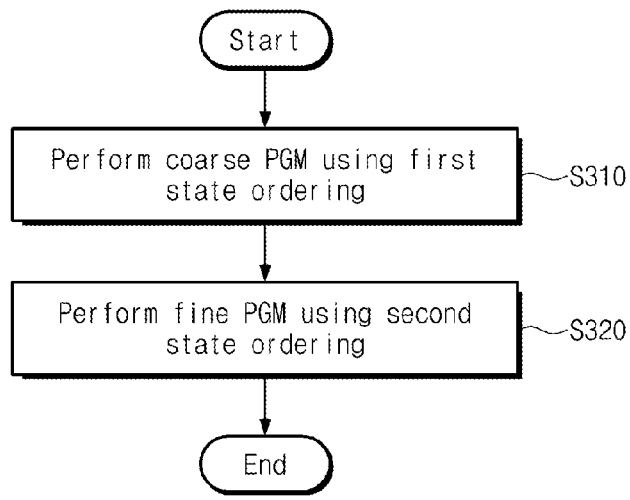
FIG. 12 is a flowchart illustrating a reprogramming method, according to an embodiment of the inventive concept.

FIG. 12 is a flowchart illustrating a reprogramming method according to an embodiment of the inventive concept.

Referring to FIGS. 9 and 12, in step S310, a coarse program operation is performed using a first state ordering to improve a programming speed. After the coarse program operation, in step S320, a fine program operation is performed using a second state ordering. Here, the second state ordering is a default state ordering, and the first state ordering is a converted default state ordering. The reprogramming method according to an embodiment of the inventive concept performs a coarse program operation and a fine program operation using different state orderings. This embodiment may convert state data in response to a state data converting signal (or, information) provided from an external device.

Figure 13:
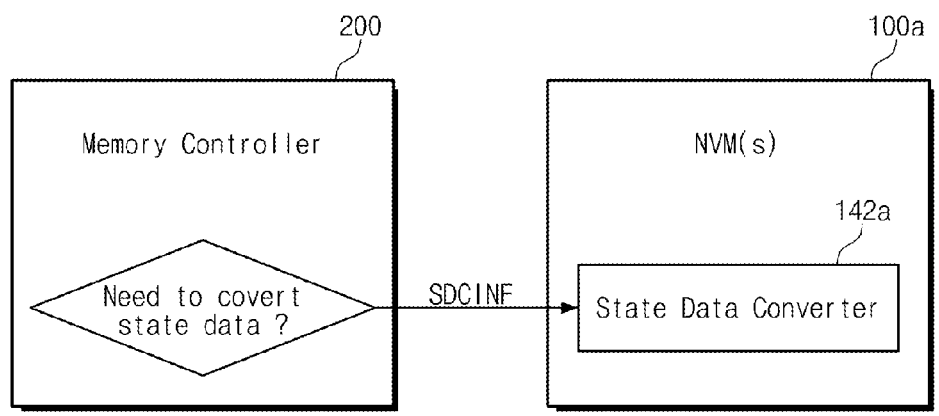
FIG. 13 is a block diagram illustrating a memory system, according to an embodiment of the inventive concept.

FIG. 13 is a block diagram illustrating a memory system according to an embodiment of the inventive concept.

Referring to FIG. 13, a memory system 10 comprises one or more nonvolatile memory devices 100a and a memory controller 200 controlling the one or more nonvolatile memory devices 100a.

Memory controller 200 determines whether state data need be converted, based on one of various operation conditions, and sends state data converting information SDCINF to nonvolatile memory device 100a according to the determination result. For example, memory controller 200 generates the state data converting information SDCINF when a faster programming speed is required.

A state data converter 142a of nonvolatile memory device 100a converts state data stored in page buffers PB1 to PBn based on the state data converting information SDCINF. Afterwards, nonvolatile memory device 100a performs a program operation based on the converted state data.

Memory system 10 according to an embodiment of the inventive concept determines whether converting of state data is required and converts the state data according to the determination result.

Figure 14:
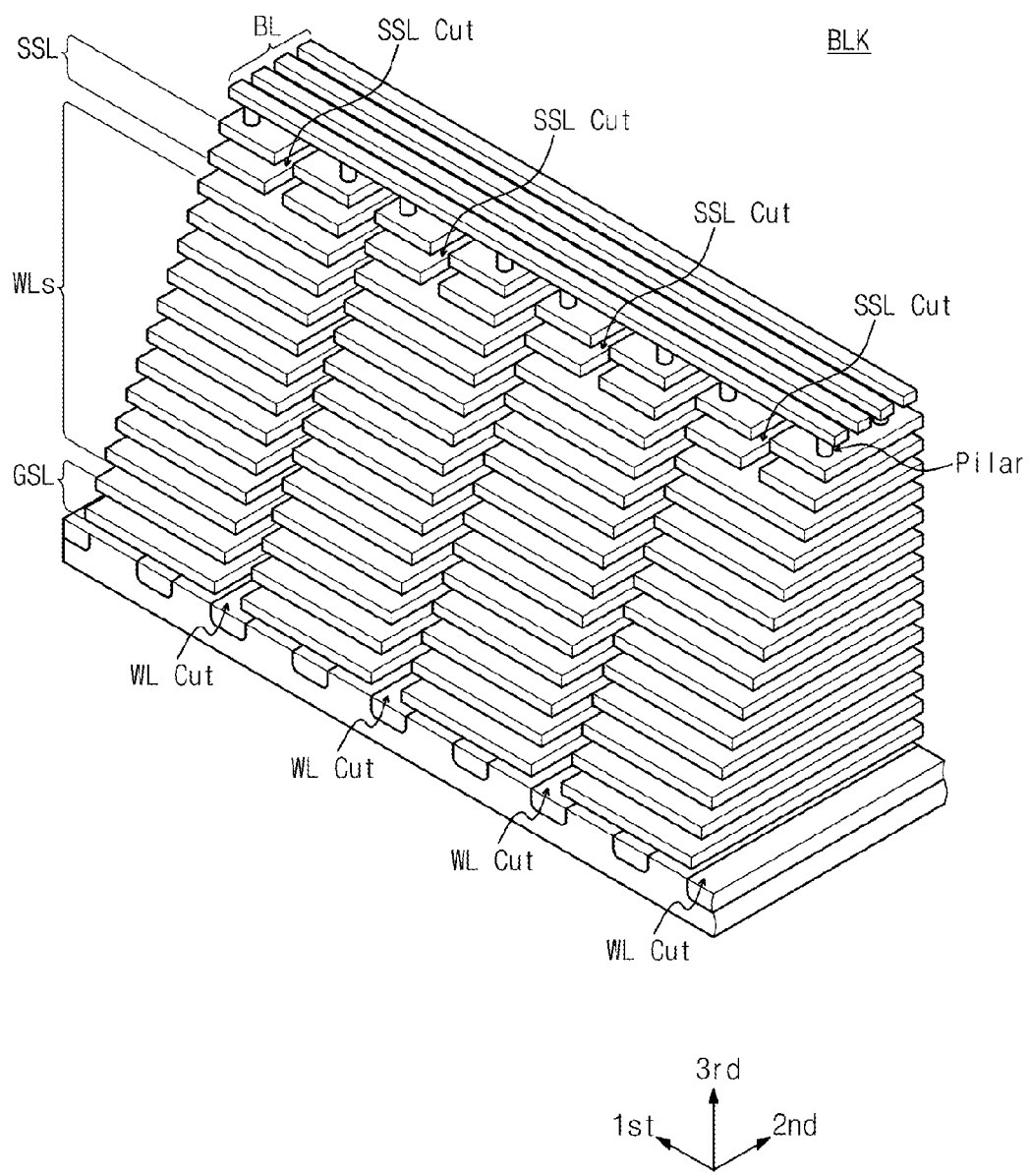
FIG. 14 is a perspective view of a memory block of a VNAND, according to an embodiment of the inventive concept.

FIG. 14 is a perspective view of a memory block of a VNAND, according to an embodiment of the inventive concept.

Referring to FIG. 14, four sub blocks are formed on a substrate. Each sub block is formed by stacking at least one ground selection line GSL, multiple word lines, and at least one string selection line SSL on the substrate between word line cuts in a plate shape. String selection line SSL is separated by string selection line cuts. Although not shown in FIG. 14, each word line cut may include a common source line CSL. In some embodiments, common source lines CSL in the word line cuts may be interconnected. A string may be formed by making a pillar 113 connected to a bit line penetrate the at least one string selection line SSL, the word lines, and the at least one ground selection line GSL.

Although FIG. 14 illustrates an embodiment in which a structure between word line cuts is a sub block, the inventive concept is not limited to this structure. For example, a structure between a word line cut and a string selection line cut may be defined as a sub block. Memory block BLK may be implemented to have a merged word line structure where two word lines are merged to one.

Figure 15:
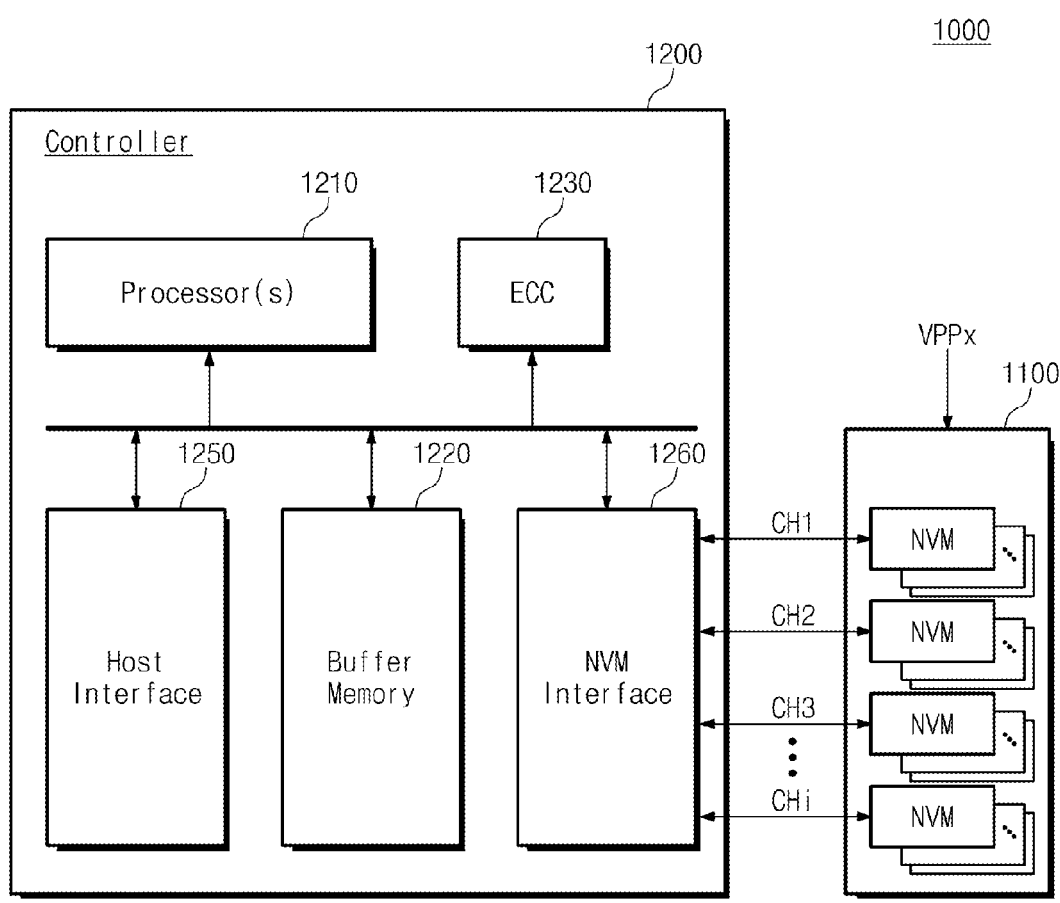
FIG. 15 is a block diagram illustrating a solid state drive, according to an embodiment of the inventive concept.

FIG. 15 is a block diagram illustrating a solid state drive (SSD) according to an embodiment of the inventive concept.

Referring to FIG. 15, an SSD 1000 comprises multiple nonvolatile memory devices 1100 and an SSD controller 1200. Nonvolatile memory devices 1100 may be designed to be provided with an external high voltage VPPx. Each of nonvolatile memory devices 1100 is implemented to perform a program/verification operation under a condition that state data is selectively converted as described with reference to FIGS. 1 to 13.

SSD controller 1200 is connected to nonvolatile memory devices 1100 through multiple channels CH1 to CHi (i being an integer of 2 or more). SSD controller 1200 includes one or more processors 1210, a buffer memory 1220, an ECC block 1230, a host interface 1250, and a nonvolatile memory interface 1260.

Buffer memory 1220 stores data needed to drive SSD controller 1200. Buffer memory 1220 may include multiple memory lines each storing data or a command. ECC block 1230 calculates error correction code values of data to be programmed at a writing operation and corrects an error of read data using an error correction code value at a read operation. At a data recovery operation, ECC block 1230 corrects an error of data recovered from nonvolatile memory devices 1100. Although not shown in FIG. 15, a code memory is further included to store code data needed to drive SSD controller 1200. The code memory is implemented by a nonvolatile memory device.

Host interface 1250 provides an interface with an external device. Nonvolatile memory interface 1260 provides an interface with nonvolatile memory devices 1100.

SSD 1000 may improve programming speed by converting state data as occasion demands.

Figure 16:
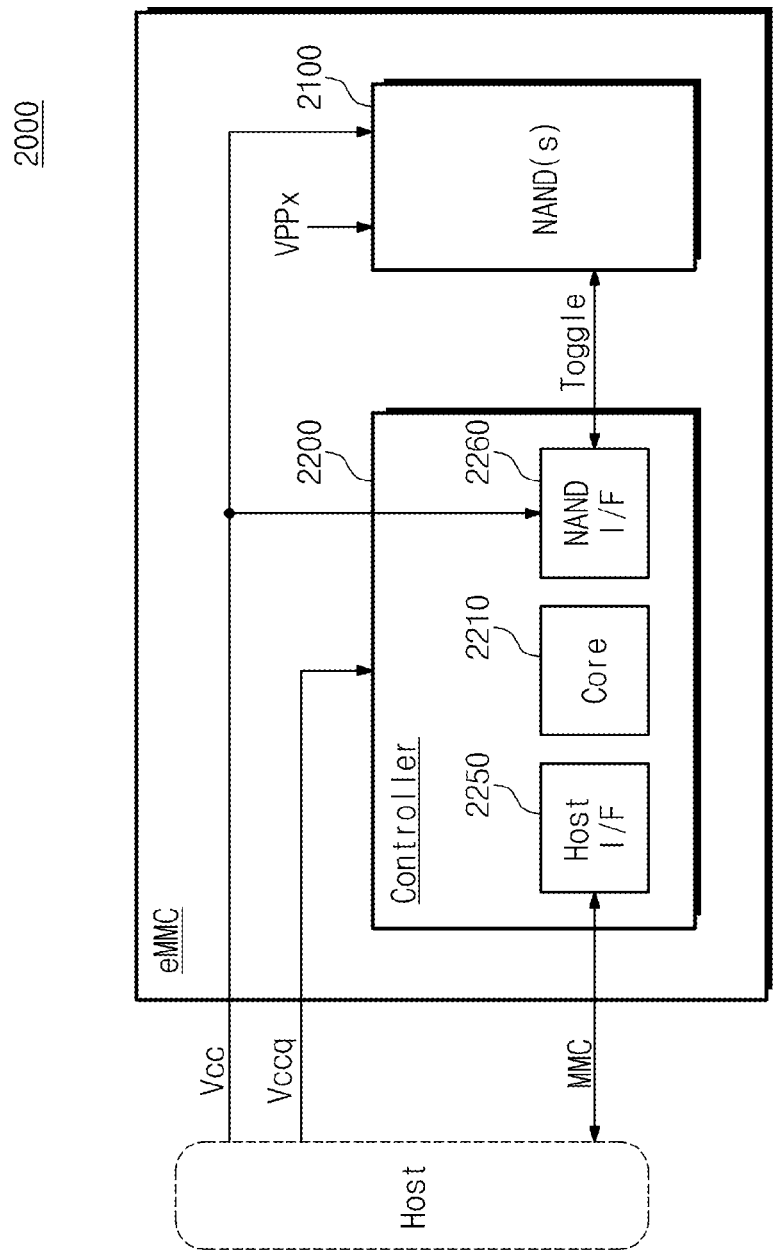
FIG. 16 is a block diagram illustrating an eMMC, according to an embodiment of the inventive concept.

FIG. 16 is a block diagram illustrating an eMMC, according to an embodiment of the inventive concept.

Referring to FIG. 16, an eMMC 2000 comprises one or more NAND flash memory devices 2100 and controller 2200.

NAND flash memory device 2100 is implemented by a single data rate (SDR) or a double data rate (DDR) NAND flash memory. EMMC 2000 is implemented by storage 100 shown in FIG. 1. As a vertical NAND (VNAND), NAND flash memory device 2100 is implemented to convert state data as occasion demands. Controller 2200 is connected with NAND flash memory device 2100 via multiple channels. Controller 2200 comprises one or more controller cores 2210, a host interface 2250, and a NAND interface 2260. Controller core 2210 controls an overall operation of eMMC 2000. Host interface 2250 is configured to perform an interface between controller 2210 and a host. NAND interface 2260 is configured to provide an interface between NAND flash memory device 2100 and controller 2200. In some embodiments, host interface 2250 may be a parallel interface (e.g., an MMC interface). In other example embodiments, host interface 2250 of eMMC 2000 may be a serial interface (e.g., UHS-II, UFS, etc.).

EMMC 2000 receives power supply voltages Vcc and Vccq from the host. Herein, power supply voltage Vcc (e.g., about 3.3V) is supplied to NAND flash memory device 2100 and NAND interface 2260, and power supply voltage Vccq (e.g., about 1.8V/3.3V) is supplied to controller 2200. In some embodiments, eMMC 2000 may be optionally supplied with an external high voltage. EMMC 2000 may convert state data to improve programming speed, as described above.

Figure 17:
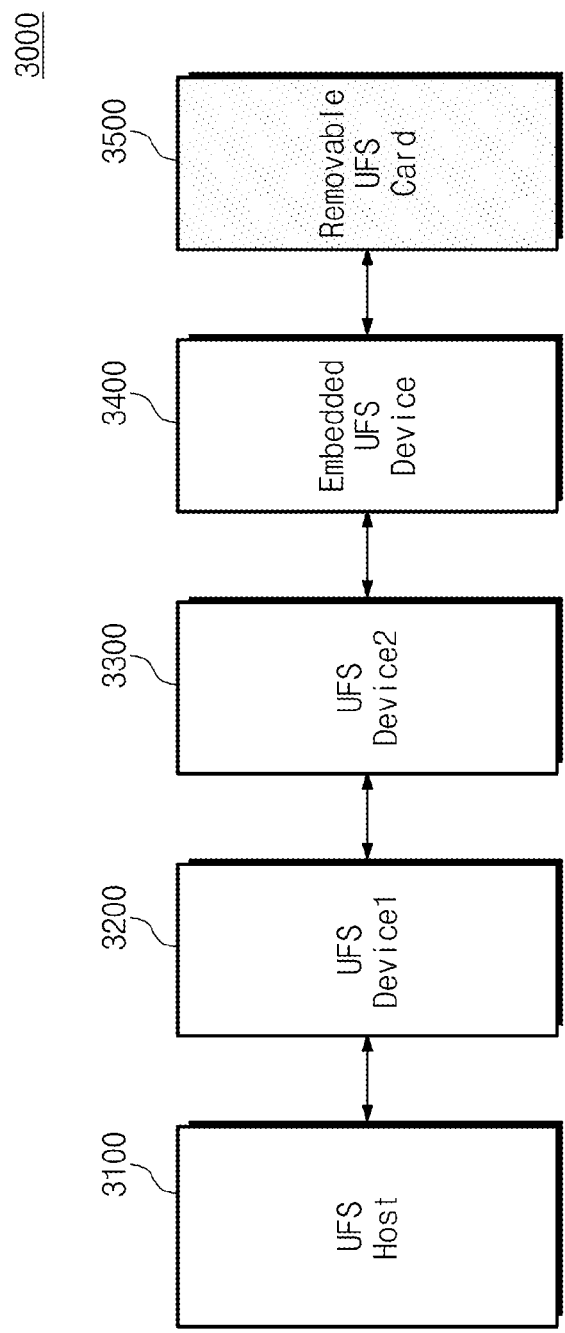
FIG. 17 is a block diagram illustrating a UFS system, according to an embodiment of the inventive concept.

FIG. 17 is a block diagram illustrating a UFS system, according to an embodiment of the inventive concept.

Referring to FIG. 17, a UFS system 3000 comprises a UFS host 3100, UFS devices 3200 and 3300, an embedded UFS device 3400, and a removable UFS card 3500. UFS host 3100 is an application processor of a mobile device. UFS host 3100 is implemented by a host 200 shown in FIG. 1. Each of UFS host 3100, UFS devices 3200 and 3300, embedded UFS device 3400, and removable UFS card 3500 may communicate with external devices through the UFS protocol. At least one of UFS devices 3200 and 3300, embedded UFS device 3400, and removable UFS card 3500 may be implemented by a nonvolatile memory device shown in FIG. 1 or a memory system 10 shown in FIG. 10.

Meanwhile, embedded UFS device 3400 and removable UFS card 3500 may perform communications using protocols different from the UFS protocol. UFS host 3100 and removable UFS card 3500 may communicate through various card protocols (e.g., UFDs, MMC, SD (secure digital), mini SD, Micro SD, etc.).

Figure 18:
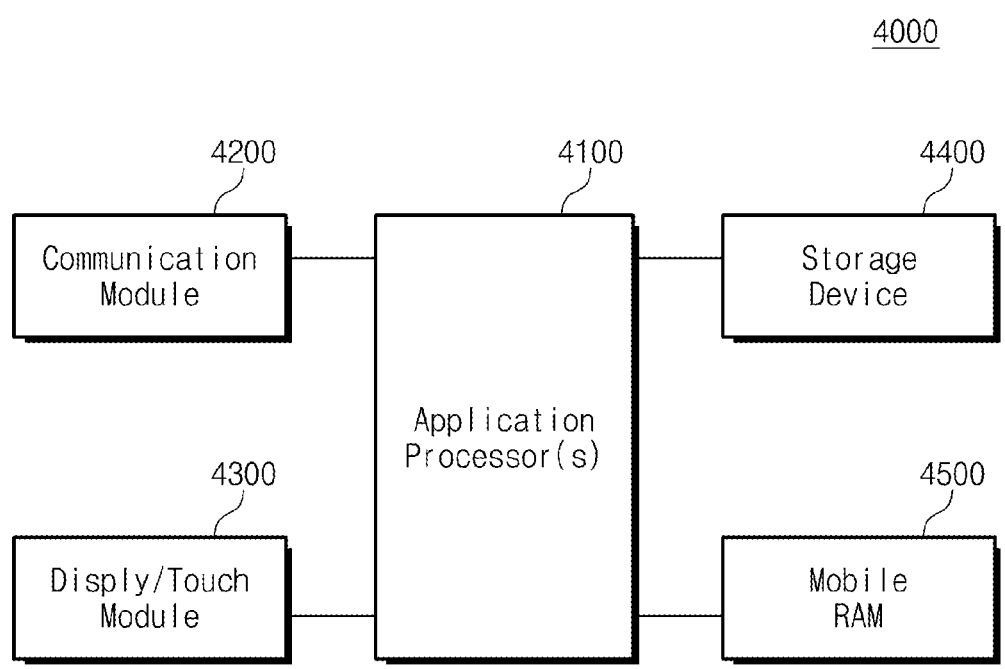
FIG. 18 is a block diagram illustrating a mobile device, 4000 according to an embodiment of the inventive concept.

FIG. 18 is a block diagram illustrating a mobile device 4000 according to an embodiment of the inventive concept.

Referring to FIG. 18, mobile device 4000 comprises an application processor 4100, a communication module 4200, a display/touch module 4300, a storage device 4400, and a mobile RAM 4500.

Application processor 4100 controls an operations of mobile device 4000. Communication module 4200 performs wireless or wire communications with an external device. Display/touch module 4300 displays data processed by application processor 4100 or receives data through a touch panel. Storage device 4400 stores user data. Storage device 4400 may be an eMMC, SSD, or UFS device, for example. Storage device 4400 performs a program verification operation after converting of state data described with reference to FIGS. 1 to 13. Mobile RAM 4500 temporarily stores data for a processing operation of mobile device 4000.

Mobile device 4000 improves the performance overall through storage device 4400 that is implemented to improve a programming speed.

A memory system or a storage device according to an embodiment of the inventive concept may be packaged using various packages such as Package on Package (PoP), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), System In Package (SIP), Multi Chip Package (MCP), Wafer-level Fabricated Package (WFP), Wafer-Level Processed Stack Package (WSP), or the like.

The foregoing is illustrative of embodiments and is not to be construed as limiting thereof. Although a few embodiments have been described, those skilled in the art will readily appreciate that many modifications are possible in the embodiments without materially departing from the scope of the inventive concept. Accordingly, all such modifications are intended to be included within the scope of the inventive concept as defined in the claims.

What is claimed is:

1. A method of programming a nonvolatile memory device, comprising:

performing an N-th program loop based on state data stored in data latches according to a default state ordering;

determining whether conversion of the default state ordering is required according to a predetermined criterion;

as a consequence of determining that conversion of the default state ordering is required, converting all or part of the state data stored in the data latches from the default state ordering to another state ordering; and performing a (N+1)th program loop based on the converted state data.

2. The method of claim 1, wherein the predetermined criterion is whether a predetermined number of program loops has been performed.

3. The method of claim 1, wherein the predetermined criterion is whether a predetermined state is program passed.

4. The method of claim 3, wherein the nonvolatile memory device comprises k-bit multi-level cells (k>1), wherein each of the k-bit multi-level cells is programmed to have one of $2^k$ states, and wherein the predetermined state is a state having a $(2^k-y)$th threshold voltage from among the $2^k$ states, y being a maximum value of kCx and x being a number of 1's or 0's.

5. The method of claim 3, wherein the converting comprises setting state data corresponding to states having a threshold voltage lower than that of the predetermined state to don't care.

6. The method of claim 1, wherein the determination of whether conversion of the default state ordering is required is performed according to state data information provided from an external device.

7. The method of claim 1, wherein the (N+1)th program loop comprises a program operation period where a program pulse is applied and a verification operation period where verification pulses are applied.

8. The method of claim 7, wherein the verification operation period comprises a state selection period for selecting a state to be verified and a verification pulse applying period for applying a verification pulse corresponding to the selected state.

9. The method of claim 8, wherein the state to be verified is determined by dumping the converted state data stored in the data latches to a sense latch during the state selection period.

10. The method of claim 8, wherein the nonvolatile memory device comprises k-bit multi-level cells (k>1);

wherein each of the k-bit multi-level cells is programmed to have one of $2^k$ states; and wherein verification pulses are sequentially applied with respect to remaining states of the $2^k$ states other than an erase state during the verification operation period.

11. The method of claim 8, wherein the nonvolatile memory device comprises k-bit multi-level cells (k>1);

wherein each of the k-bit multi-level cells is programmed to have one of $2^k$ states; and wherein verification pulses are sequentially applied with respect to the $2^k$ states during the verification operation period.

12. The method of claim 11, wherein at least one of the verification pulses has a negative voltage.

* * * * *